(12) United States Patent
Ota et al.

(10) Patent No.: US 6,987,272 B2
(45) Date of Patent: Jan. 17, 2006

(54) WORK PIECE TRANSFER SYSTEM FOR AN ION BEAM IMPLANTER

(75) Inventors: Kan Ota, Cambridge, MA (US); Mehran Asdigha, Shrewsbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/794,009

(22) Filed: Mar. 5, 2004

(65) Prior Publication Data

US 2005/0194549 A1    Sep. 8, 2005

(51) Int. Cl.
*H01J 37/317* (2006.01)
(52) U.S. Cl. .................. 250/442.11; 250/441.11
(58) Field of Classification Search .......... 250/492.21, 250/442.11, 441.11; 414/217, 331
See application file for complete search history.

(56) References Cited

U.S. PATENT DOCUMENTS

| | | | |
|---|---|---|---|
| 4,293,137 A | 10/1981 | Ezekiel | |
| 4,761,559 A | 8/1988 | Myron | |
| 4,975,586 A | 12/1990 | Ray | |
| 5,003,183 A | 3/1991 | Nogami et al. | |
| 5,229,615 A | 7/1993 | Brune et al. | |
| 5,436,790 A | 7/1995 | Blake et al. | |
| 5,444,597 A | 8/1995 | Blake et al. | |
| 5,486,080 A | 1/1996 | Sieradzki | |
| 5,882,165 A * | 3/1999 | Maydan et al. | 414/217 |
| 6,163,033 A | 12/2000 | Smick et al. | |
| 6,207,959 B1 | 3/2001 | Satoh et al. | |
| 6,350,097 B1 | 2/2002 | Mitchell et al. | |
| 6,555,825 B1 | 4/2003 | Mitchell et al. | |

* cited by examiner

*Primary Examiner*—Kiet T. Nuygen
(74) *Attorney, Agent, or Firm*—Watts Hoffmann Co, LPA

(57) ABSTRACT

A work piece transfer apparatus for use with an ion beam implanter for treating a work piece at sub-atmospheric pressure. The work piece transfer apparatus includes an evacuable load lock system in fluid communication with an interior region the implantation chamber interior region. The load lock system includes a support surface for supporting the work piece with an opening aligned with the work piece. The work piece transfer apparatus further includes a work piece support within the implantation chamber having a pedestal supported by a linkage with two degrees of freedom. The linkage moves the pedestal transversely through the load lock support surface opening to pick up the work piece from the support surface prior to treatment. The pedestal holds the work piece in position in the implantation chamber for treatment. The linkage then moves the pedestal transversely through the load lock support surface opening to deposit the work piece on the support surface subsequent to treatment.

23 Claims, 4 Drawing Sheets

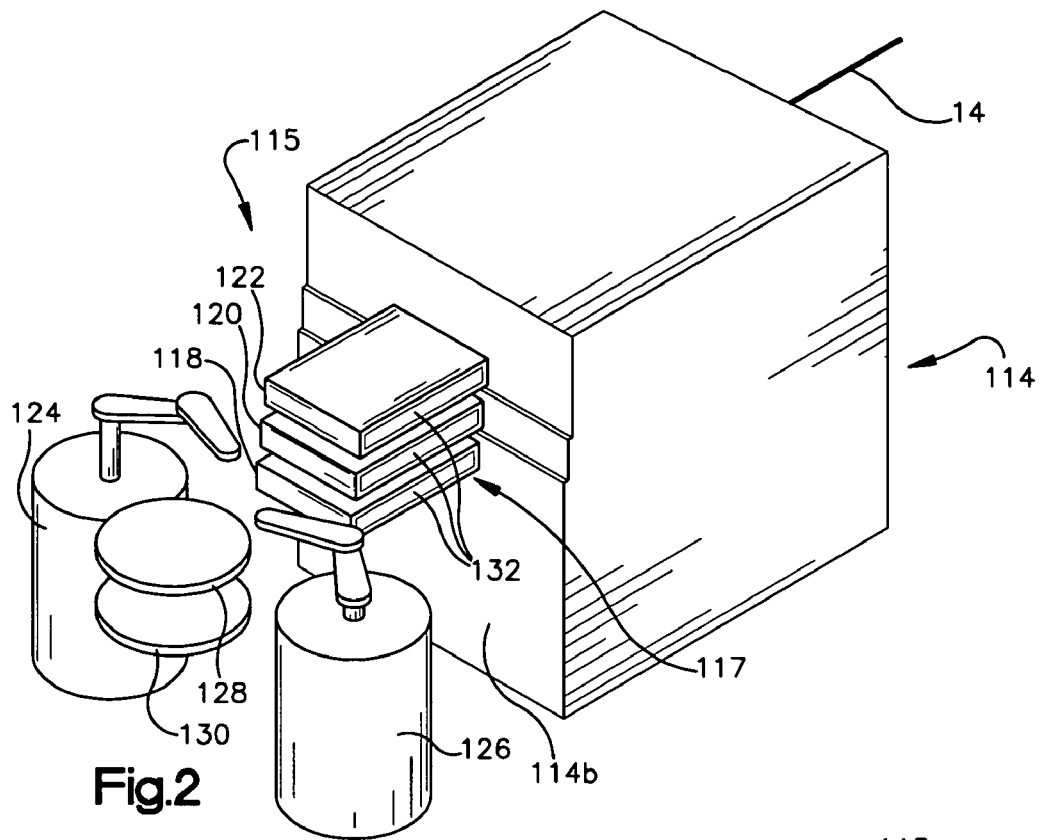
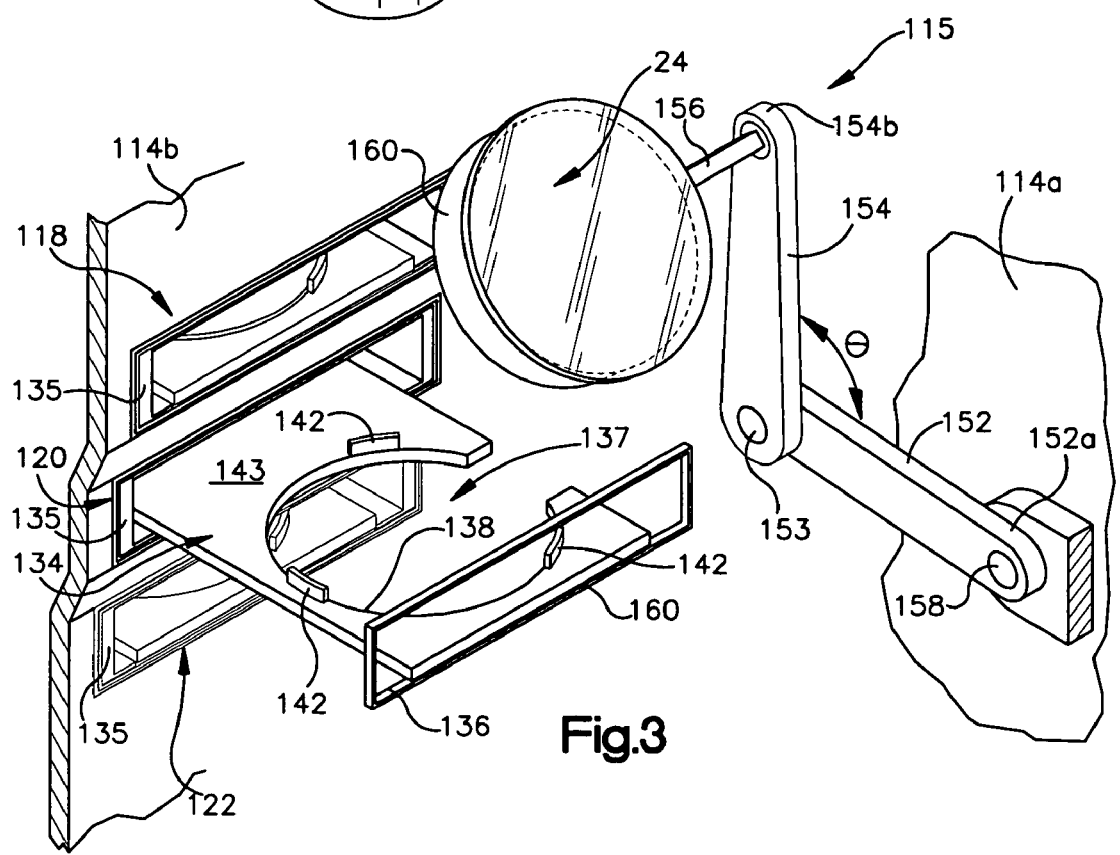

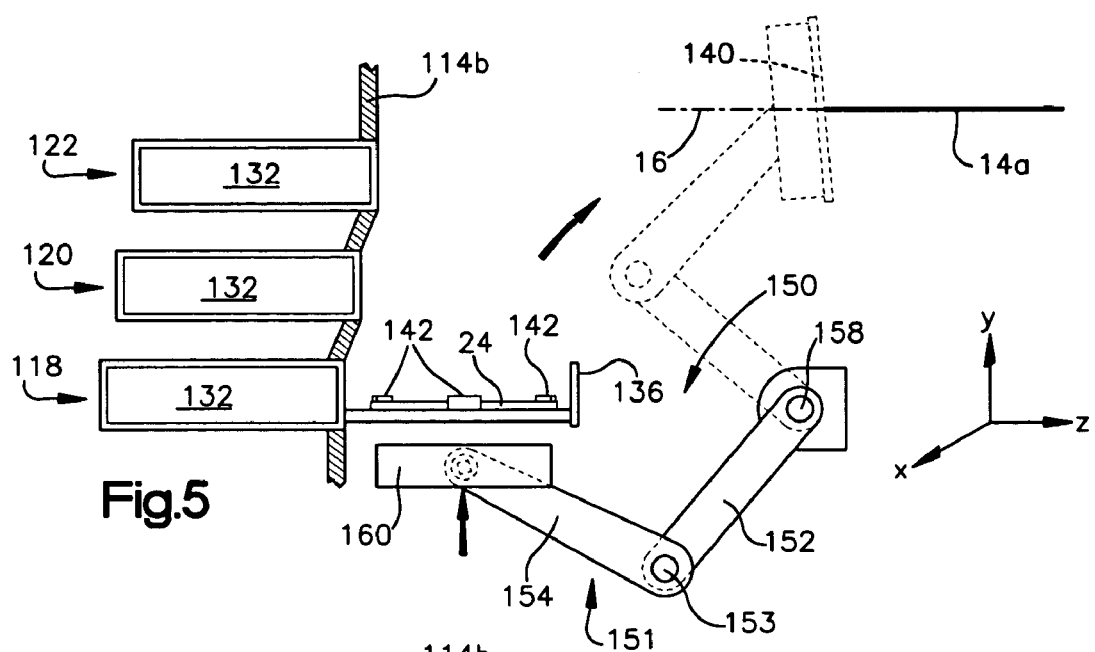
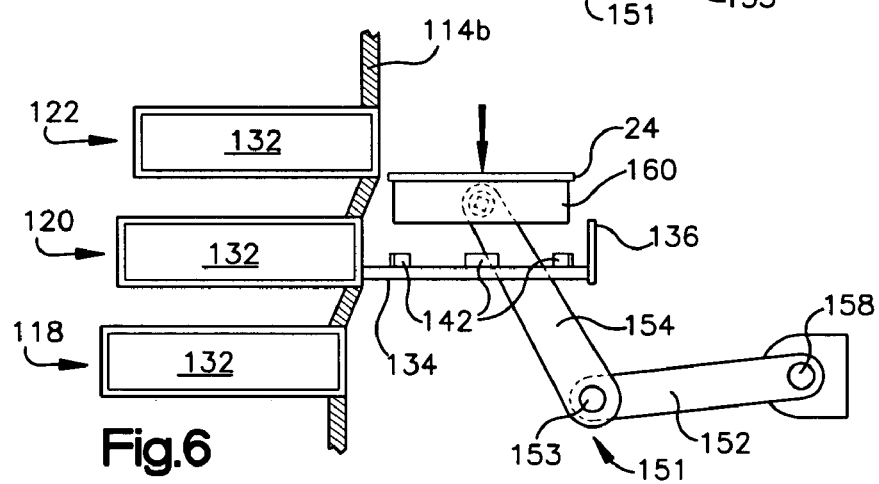
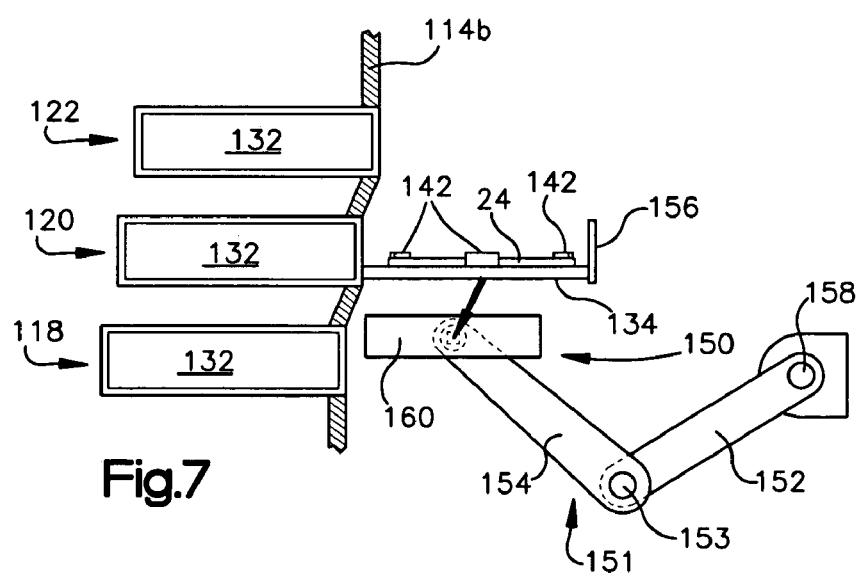

us 6,987,272 B2

WORK PIECE TRANSFER SYSTEM FOR AN ION BEAM IMPLANTER

FIELD OF THE INVENTION

The present invention concerns a work piece transfer system for an ion beam implanter and, more specifically, concerns a work piece transfer system that eliminates the need for a work piece transfer subsystem disposed in an evacuated, sub-atmospheric region of the ion beam implanter where work piece treatment takes place.

BACKGROUND ART

Ion beam implanters are widely used in the process of doping semiconductor wafers. An ion beam implanter generates an ion beam comprised of desired species of positively charged ions. The ion beam impinges upon an exposed surface of a work piece such as a semiconductor wafer, substrate or flat panel, thereby "doping" or implanting the work piece surface with desired ions. Many ion implanters utilize serial implantation wherein one relatively large work piece is positioned on a work piece support in an evacuated implantation chamber or end station and implanted or "doped" with desired ions. After implantation is completed, the work piece is removed from the work piece support and another work piece is positioned on the support.

An ion implantation chamber of an ion beam implanter is maintained at reduced pressure. Subsequent to acceleration along a beam line, the ions in the beam enter the implantation chamber and strike the work piece. In order to position work pieces for implantation by the ion beam within the ion implantation chamber, a work piece transfer system is necessary. Work pieces ready for processing are stored in a storage device or buffer. The work piece transfer system includes a first robot system to move the work pieces from a storage device into a load lock system. The first robot system, which is at atmospheric pressure ("in-air"), includes two robotic arms. A first robotic arm moves work pieces from the storage device to an aligner, where the work piece is rotated to a particular crystal orientation. A second robotic arm moves the aligned work piece from the aligner to the load lock system.

The load lock system is in communication with the evacuated implantation chamber and includes one or more load locks for receiving a work piece. The load locks can be selectively evacuated. When a work piece is positioned in a load lock by the second robotic arm, the load lock is closed and pumped down to a reduced pressure. After the load lock is reduced to a suitable pressure, a sliding door on the load lock is opened so that the work piece is made available for transfer into the implantation chamber interior region.

In prior art ion implanters, the work piece transfer system further included a second robot system located within the evacuated implantation chamber ("in-vacuum") for moving a work piece from the load lock to the work piece support, where the work piece was positioned for implantation. After implantation of the work piece, the second robot system removed the implanted work piece from the work piece support and return to the load lock. The first in-air robot system then moves the implanted work piece from the load lock to a storage device. U.S. Pat. No. 5,486,080 to Sieradzki concerns a system for high speed movement of work pieces in vacuum processing. The system employs two wafer transport robots for moving wafers from two load locks past a processing station. Additional patents relating to serial implantation end stations are U.S. Pat. Nos. 6,350,097, 6,555,825, and 5,003,183.

While work piece transfer systems including a second in vacuum robot system disposed within the implantation chamber are workable, it would be highly desirable to simplify the work piece transfer system by eliminating the second in-vacuum robot system. The in-vacuum robot system is both costly and complex and, by virtue of the fact that it is located within the implantation chamber, requires space within the evacuated implantation chamber. Since the implantation chamber requires a pumping system for maintaining the chamber interior region in a reduced pressure state, it is desirable to minimize, to the extent possible, the size of the chamber interior region. Further, smaller chambers are desirable in that they require less clean room space.

The present invention is directed to a work piece transfer system for an ion beam implanter that eliminates the need for an in-vacuum robot transfer system disposed within an evacuated implantation chamber of the implanter.

SUMMARY OF THE INVENTION

A work piece transfer apparatus is disclosed for use with an ion beam implanter for treating a work piece at sub-atmospheric pressure. The work piece transfer apparatus of the present invention transfers work pieces from a higher pressure storage area to a reduced pressure interior region of an implantation chamber and, after the work piece is suitably treated in the implantation chamber, back to a higher pressure storage area.

The work piece transfer system includes an in-air robot system, a load lock system in fluid communication with the implantation chamber interior region and a work piece support within the implantation chamber that positions a work-piece for treatment within the chamber interior region. This eliminates the need for an in vacuum robot system within the implantation chamber for transferring work pieces from the load lock system to the work piece support. The load lock system includes a plurality of load locks in communication with the implantation station interior region. Each load lock defines an interior region that can be evacuated and includes a moving tray. Each moving tray includes an opening and a grip for holding the work piece on the tray.

The work piece support includes a support linkage capable of movement with two degrees of freedom, that is, of independent movement along two axes. The work piece support also includes a work piece pedestal for picking up a work piece and holding the work piece in a desired position during implantation. The pedestal is sized to move through the opening of the load lock tray so as to pick up a work piece positioned on the tray for implantation of the work piece and to subsequently deposit the work piece back onto the tray after implantation.

In one preferred embodiment, the work piece transfer system operates as follows. The in-air robot system, at atmospheric pressure, transfers work pieces from a storage area onto the moving tray of one of a plurality of load lock chambers of the load lock system. The in-air robot system deposits the work piece on the tray such that the work piece is aligned with the tray opening and in contact with a work piece grip of the tray. Upon receipt of a work piece, the load lock closes and pressure within the load lock is reduced to a suitable pressure.

After a suitable pressure is achieved, a door of the load lock adjacent the implantation chamber opens and the tray (with the work piece on the tray) moves into the implantation chamber interior region. The work piece support linkage moves the work piece pedestal orthogonally through the tray opening thereby lifting the work piece from tray. The support linkage then moves the pedestal such that the work piece is in proper alignment for implantation or treatment by the ion beam of the ion beam implanter. After implantation, the support linkage moves the pedestal orthogonally through the tray opening and the implanted work piece is deposited on the tray. The tray is retracted into the load lock and subsequently removed by the in-air robot system to a storage area.

In one aspect, the present invention involves a work-piece transfer apparatus for use with a ion implanter having an implantation chamber for treatment of a work piece at sub-atmospheric pressure. The work piece transfer apparatus includes:

a) a load lock system in fluid communication with an interior region the implantation chamber interior region, the load lock system defining an interior region which can be selectively evacuated for achieving a reduced pressure condition in the interior region, the load lock system having a support surface for supporting the work piece, the load lock support surface including an opening aligned with the work piece when the work piece is disposed on the load lock support surface; and b) a work piece support within the implantation chamber that positions a work piece for treatment within the chamber interior region, the work piece support including a work piece pedestal for picking up the work piece from the support surface of the load lock system prior to treatment, holding the work piece in position during treatment, and depositing the work piece on the support surface of the load lock system subsequent to treatment, the work piece support including a support linkage for moving the work piece pedestal through the opening in the load lock support surface to pick up the work piece from the support surface prior to treatment and deposit the work piece on the support surface subsequent to treatment.

In another aspect, the present invention involves a method of treating a work piece positioned in a reduced pressure implantation station with an ion beam. The steps of the method include:

a) providing a work piece transfer system including:
1) a load lock system in fluid communication with an interior region the implantation chamber interior region, the load lock system defining an interior region which can be selectively evacuated for achieving a reduced pressure condition in the interior region, the load lock system having a support surface for supporting the work piece, the load lock support surface including an opening aligned with the work piece when the work piece is disposed on the load lock support surface; and
2) a work piece support within the implantation chamber that positions a work piece for treatment within the chamber interior region, the work piece support including a work piece pedestal for picking up the work piece from the support surface of the load lock system prior to treatment, holding the work piece in position during treatment, and depositing the work piece on the support surface of the load lock system subsequent to treatment, the work piece support including a support linkage for moving the work piece pedestal through the opening in the load lock support surface to pick up the work piece from the support surface prior to treatment and deposit the work piece on the support surface subsequent to treatment;

b) positioning a work piece on the support surface of the load lock system;

c) utilizing the work piece support to pick up the work piece from the support surface of the load lock system and holding the work piece in position in the implantation chamber interior region for treatment;

d) treating the work piece; and e) utilizing the work piece support to deposit the work piece on the support surface of the load lock system subsequent to completion of treatment.

These and other objects advantages and features of the invention will be understood from a review of a detailed description of alternate exemplary embodiments of the invention which are described in conjunction with the accompanying drawings.

BRIEF DESCRIPTION OF THE DRAWINGS

FIG. 2 is a schematic perspective view of the work piece transfer system of the present invention as viewed from outside the implantation chamber;

FIG. 3 is a schematic perspective view of the work piece transfer system of FIG. 2 as viewed from inside the implantation chamber;

FIG. 5 is a schematic view, partly in side elevation and partly in section, of a portion of the work piece transfer system of FIG. 3 utilizing the lower of three load locks;

FIG. 6 is a schematic view, partly in side elevation and partly in section, of a portion of the work piece transfer system of FIG. 3 utilizing the middle of three load locks; and FIG. 7 is a schematic view, partly in side elevation and partly in section, of a portion of the work piece transfer system of FIG. 3 utilizing the middle of three load locks.

DETAILED DESCRIPTION

Figure 1:
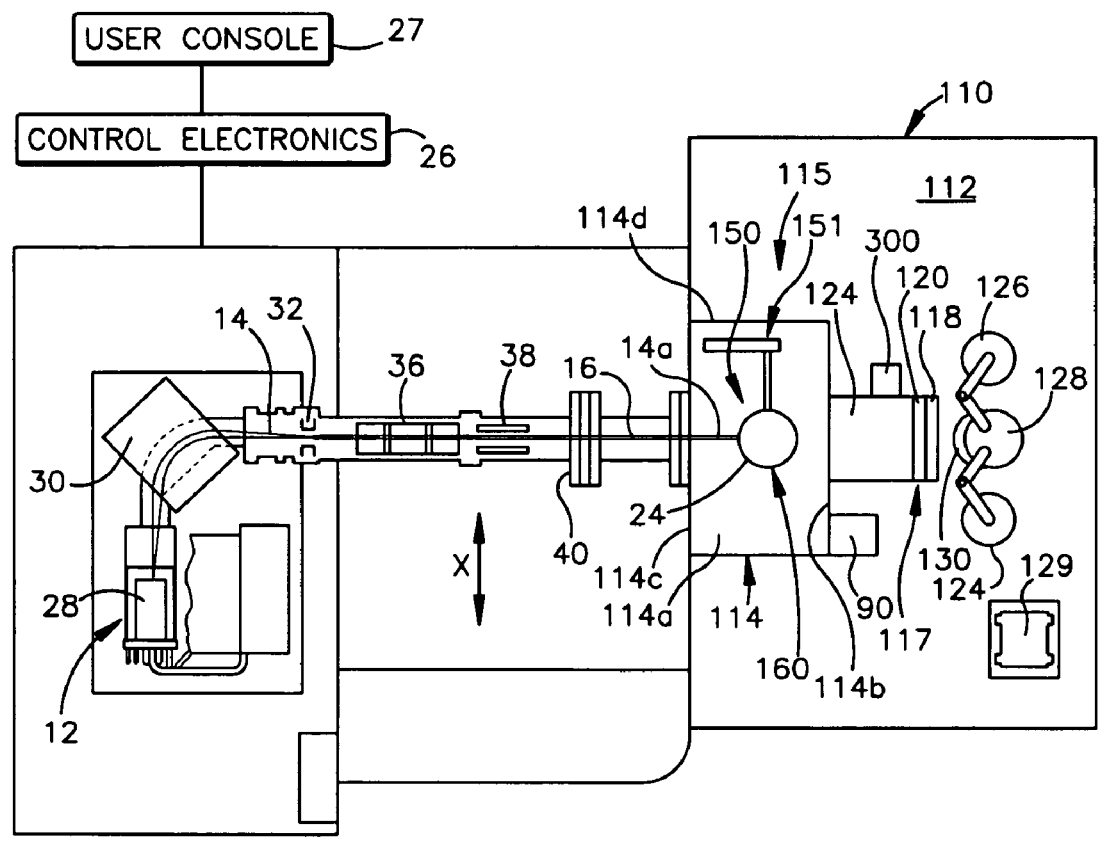
FIG. 1 is a schematic plan view of an ion beam implanter of the present invention including a work piece transfer system that eliminates the need for robotic arms within the implantation chamber to position and remove the work piece from the work piece support or pedestal.

Turning to the drawings, an ion beam implanter is shown generally at 10 in FIG. 1. The implanter includes an ion source 12 for creating ions that form an ion beam 14 which traverses a beam path 16 to an end or implantation station 110. The implantation station includes a vacuum or implantation chamber 114 defining an reduced pressure ("in-vac") interior region 114a in which a workpiece 24 such as a semiconductor wafer or a flat panel or a substrate is positioned for implantation by the ion beam 16. Control electronics (shown schematically at 26) are provided for monitoring and controlling the ion dosage received by the workpiece 24. Operator input to the control electronics 26 are performed via a user console 27.

The ion source 12 generates the ion beam 14 which impacts the work piece 24. The ions in the ion beam 14 tend to diverge as the beam traverses a distance along the beam path 16 between the ion source 12 and the implantation chamber 22. The ion source 12 includes a plasma chamber 28 defining an interior region into which source materials are injected. The source materials may include an ionizable gas or vaporized source material.

Positioned along the beam path 16 is an analyzing magnet 30 which bends the ion beam 14 and directs it through a beam shutter 32. Subsequent to the beam shutter 32, the beam 14 passes through a quadruple lens system 36 that focuses the beam 14. The beam path 16 extends through deflection electrodes 38, 40 wherein the ion beam 14 is repetitively deflected or scanned to generate a ribbon ion beam such that a portion of the ion beam 14 within the implantation chamber 22 is a ribbon ion beam 14a. The ribbon ion beam 14a enters the implantation chamber 114 through an opening in a front wall 114c of the chamber 114. The ribbon ion beam 14a is an ion beam that essentially has the shape of a very narrow rectangle that is, a beam that extends in one direction, e.g., has a horizontal or x direction extent with very limited extent in the orthogonal direction, e.g., in the vertical or y direction.

Generally, the extent of the ribbon ion beam 14a is sufficient to implant the entire corresponding dimension of the work piece 24, that is, if the ribbon ion beam 14a traversing the implantation chamber 22 extends in the horizontal or x direction (FIG. 1) and the work piece 24 has a horizontal dimension of 300 mm. (or a diameter of 300 mm.). The control electronics 26 will appropriately energize the electrode 38 such that a horizontal extent, W, of the ribbon ion beam 14a, upon striking the work piece 24 within the implantation chamber 114, will be at least 300 mm. The electrode 38 deflects the beam 14 and a parallelizing lens 40 is positioned along the beam line 16 to correct for the beam angle deflection caused by the electrode 38 such that the ribbon ion beam 14a is parallel when it implants the work piece 24.

FIGS. 2 through 7 depict a work piece transfer system 115 of the present invention which functions to obtain a work piece 24 from a storage area, transfers the work piece 24 through the in-air (or atmospheric pressure) region 112 of the end station 110 to a load lock apparatus 117 where a reduced pressure condition is achieved, and further transfers the work piece 24 from the load lock apparatus 117 to an implantation position intersecting the ion beam beam line 15 for implantation of the work piece 24 by the ribbon ion beam 14a.

The work piece transfer system 115, which operates under the control of the control apparatus 26, includes the load lock apparatus 117, a pair of robots 124, 126 positioned in the in-air region 112 of the end station 110 and a work piece support 150 positioned in the in-vac region 114a of the implantation chamber 114. The pair of robots 124, 126 transfer the work piece 24 from a storage area to the load lock apparatus 117. The work piece support 150 transfers the work piece 24 from the load lock apparatus 117 and supports the work piece 24 at an appropriate implantation angle within the implantation chamber 114 for implantation by the ion beam 14. The work piece support 150 then returns the implanted work piece 24 to the load lock apparatus 117 after implantation is complete. The work piece support 150 functions to both transfer the work piece 24 and support the work piece during implantation, thus, eliminating the need for a separate robot disposed within the implantation chamber 114 to move the work piece 24 from the load lock apparatus 117 to a work piece support or pedestal for implantation.

As noted above, the end station 110 includes two processing areas, an in-air (or atmospheric pressure) region 112 and the in-vac (or evacuated) region 114a within the implantation chamber 114. The in-air region 112 is separated from the in-vac region 114a by the walls of the implantation chamber 114. The load lock apparatus 117 includes three load locks 118, 120, 122 that are positioned in a stacked arrangement as can be seen in FIGS. 2 and 3. One side of each of the three load locks 118, 120, 122 selectively opens, under control of the control electronics 26, to be in fluid communication with in the in-air portion 112 of the end station 110 while an end of each of the three load locks 118, 120, 122 selectively opens, under the control of the control electronics 26, to be in fluid communication with the in-vac region 114a of the implantation chamber 114. The load locks 118, 120, 122 are used to transfer work pieces from the in-air robots 124, 126 to the in-vac region 114a of the implantation chamber 114 of the end station 110 for implantation.

A given work piece 24 is transferred from a work piece buffer 128 to a selected one of the three load locks 118, 120, 122 via the two in-air robots 124, 126. The first or left in-air robot 124 transfers a work piece 24 from the wafer buffer 128 to an aligner 130. Next, the second or right in-air robot 126 transfers the work piece 24 from the aligner 130 to an empty load lock 118, 120 or 122. The right in-air robot 126 is capable of vertical movement such that it can place a work piece in either the bottom load lock 118, the middle load lock 120 or the upper load lock 122. Once the work piece 24 is processed, the right in-air robot 126 removes the work piece 24 from the appropriate load lock 118, 120, 122 and places the work piece in a processed wafer storage area 129.

As stated, the right in-air robot 126 places an oriented work piece in a selected one of the load locks 118, 120, 122 which is empty and, therefore, capable of receiving a work piece. Each load lock 118, 120, 122 includes a housing 131 defining an interior region that is capable of being selectively evacuated to a reduced pressure condition by a suitable vacuum pumping system (shown schematically at 90 in FIG. 1). Each load lock 118, 120, 122 further includes an in-air isolation valve 132 (best seen in FIG. 2) that opens to allow the in-air robot 126 to place a work piece 24 in the load lock interior region. The isolation valve 132, when closed, provides a pressure seal that separates the in-air region 112 from the in-vac region 114a of the implantation chamber and permits the interior region of the respective load lock to be pumped down to a reduced pressure by the pump 90.

In addition, each load lock 118, 120, 122 includes a movable wafer support tray 134 (best seen in FIG. 3). The support tray 134 moves along a path of travel between an unextended or enclosed position and an extended position. This can best be seen in FIG. 3 where the top and bottom load locks 118, 122 are in the enclosed position, that is, the tray 134 is within an interior region defined by the load lock housing 135. The middle load lock 120, on the other hand, is in the extended position, that is, the tray 134 (and, any work piece supported by the tray) extends into the in-vac region 114a to allow the work piece 24 to be picked up from the tray 134 by the work piece support 150 for processing and, after processing of the work piece 24, to allow the work piece 24 to be deposited back on the tray 134.

Each wafer support tray 134 has affixed thereto at a distal end of the tray an in-vac isolation valve 136. The in-vac isolation valve 136 provides a second pressure seal that, when closed, separates the in-air region 112 from the in-vac region 114a of the implantation chamber 114 and permits the interior region of the respective load lock to be pumped down to a reduced pressure condition by the pump 90. The wafer support tray 134 includes a key-hole shaped opening 137 defined by a peripheral wall 138.

When the work piece 24 is transported to a selected empty one of the load locks 118, 120, 122 by the in-air robot 126, the in-air isolation valve 132 is opened (and the in-vac isolation valve 136 remains closed). The in-air robot 126 places the work piece 24 on the support tray 134 of the selected load lock 118, 120, 122 in alignment with circular portion of the key-hole shaped opening 137. The work piece 24 is gripped and held in place by three work piece holders 142 disposed on an upper surface 143 of the support tray 134. The work piece holders 142 have a passive edge grips which supports the work piece 24 and prevents movement of the work piece 24 when the support tray 134 is moved laterally in and out of the load lock housing 135.

After the work piece 24 is loaded onto the support tray 134 by the in-air robot 126, the in-air isolation valve 132 is closed and the pressure in the load lock interior region is evacuated to a desired low pressure by the pump 90. When the work piece 24 is ready for implantation, the in-vac isolation valve 136 is opened and the work piece support tray 134 is slid into the im-vac region 114a of the implantation chamber 114. The work piece support 150, disposed in the in-vac region 114a, moves under the work piece 24 (shown in FIG. 5 in solid line) and moving upwardly through the key-hole shaped opening 137 of the work piece support tray 134, lifts the work piece 24 up from the work piece support tray 134 and, holding the work piece 24 through electrostatic attraction, positions the work piece 24 in desired alignment with the ion beam beam line 16 for implantation of the work piece 24 by the ribbon ion beam 14a (shown in dashed line in FIG. 5).

After completion of implantation of the work piece 24, the work piece support 150 moves the work piece 24 downwardly through the key-hole shaped opening 137 of the work piece support tray 134 (best seen in FIG. 6) depositing the work piece 24 on the support tray 134 (FIG. 7).

The work piece support 150 includes a support linkage 151 having two degrees of freedom of movement and a work piece pedestal 160 comprising an electrostatic chuck member. The support linkage 151 includes articulating first and second members 152, 154. The linkage 151 is fixed to the implantation chamber 114 through a conventional mount 158 affixed to a side wall 114d (FIG. 3) of the implantation chamber 114. The mount 158 is such that the first member 152 can rotate about the mount 158 during operation. The first member 152 has a first end 152a that is attached to the mount 158. The first member 152 extends in a direction towards the side wall of the implantation chamber 114 which supports the load locks 118, 120, 122. The second end 152b is mounted to the second member 154 at the first end 154a of the second member 154 via a pivotal mount 153. Again, the mounting is such that the second member 154 can pivot with respect to the position of the first member 152. The second end 154b of the second member 154 has affixed thereto a support link 156 which extends substantially perpendicular and away from to the second end 154b of the second member 154. Positioned at a distal end of the support link 156 is the electrostatic chuck 160 which supports the work piece 24 during the implantation process. The electrostatic chuck member 160 is a conventional chuck as known to those of ordinary skill in the art.

The support linkage 151 has two degrees of freedom. First, the support linkage 150 can rotate about the mount 158. The first member 152 is rotated by an actuator (not shown) attached at the first end 152a of the first member 152. The movement of the first member 152 causes the whole support linkage 151 to rotate. Additionally, the second member 154 can move with respect to the first member 152. The first end 154a of the second member 154 likewise includes an actuator (not shown) for independently moving the second member 154 with respect to the first member 152. The second member 154 rotates about the pivotal mount 153. For instance, the first member 152 connects to the second member 154 creating an angle θ with respect to the first member 152. This angle θ can vary during operation depending on which load lock wafer is being processed by a using the actuators to rotate the members 152, 154 of the linkage 150 about their pivot points. Further, an actuator is positioned at 154b (not shown) for rotating the support link 156 with respect to the second member 154. By rotating the support link 156, the chuck 160 can rotate with respect to the first member 152 and the second member 154. The actuators are direct drive motors and do not include a transmission. The actuators driving the first member 152, the second member 154 and the support link 156 are all controlled by one multi-axis motion controller 300 (see FIG. 1) which ensures coordination and synchronization of all three of the members 152, 154, 156.

The electrostatic chuck 160 is oriented in a horizontal position when capturing a wafer regardless of the increase or decrease in the angle θ created between the first member 152 and the second member 154. The chuck 160 can be oriented in any position based on the rotation of the first member 152 and the second member 154. The activation of the actuator positioned at the second end 154b of the second member 154 is determined by the rotation of the actuators at 154a and 152a. As stated, the actuators are all controlled by the multi-axis motion controller 300 which coordinates the movement of all the actuators to move the chuck 160 while maintaining a predetermined orientation of the chuck 160.

As described above, the in-air robot 126 places work pieces in the load locks 118, 120, 122. After an unprocessed work piece is placed in a selected load lock, the in-air isolation valve 132 is closed and a pump 90 draws a vacuum in the selected load lock. Upon completion of the pump down, the in-vac isolation valve 136 may be opened and the work piece support tray 134 extended into the implantation chamber 114 to start work piece processing. The fact that there are three load locks 118, 120, 122 means that the work piece transfer apparatus 115 of the present invention can serially implant work pieces with minimal downtime, that is, whenever one work piece is completed and transported by the work piece support 150 to an empty load lock, another unprocessed work piece is ready for pick up at one of the other load locks.

Referring to FIGS. 3–7, operation of the workpiece support 150 is shown. Looking at FIG. 5, the wafer support tray 134 of the bottom load lock 118 is extended fully into the in-vac region 114. At the time the support tray 134 is extended, the electrostatic chuck 160 is in a position under the wafer support tray 134. Once the tray 134 is in its most extended position, the chuck 160 positioned to capture the work piece 24 by movement of a first actuator of the first member 152 and a second actuator of the second member 154. The first actuator positions the linkage 150 to the load lock 118 while at the same time, the second actuator pivots the second member 154 so that the attached support link 156 and electrostatic chuck 160 are in a position to capture the work piece 24 for processing.

Prior to the chuck 160 contacting the wafer in the support tray 134, an electrical charge is applied to the chuck 160 so that it can firmly hold the work piece 24 once the work piece is contacted by the chuck 160. Suitable electrostatic chucks are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

As the chuck 160 is brought upward, it passes through the opening 137 in the support tray 134 defined by the peripheral wall 138. The chuck 160 passes upward through the support tray 134 through the notch extending from the circular portion of the opening 137 to the outer edge of the support tray 134. As the chuck 160 passes through the opening 137, the charge imparted on the chuck 160 attracts and removes the work piece 24 from the work piece holders 142 and holds the work piece 24 during the implantation process.

Figure 3A:
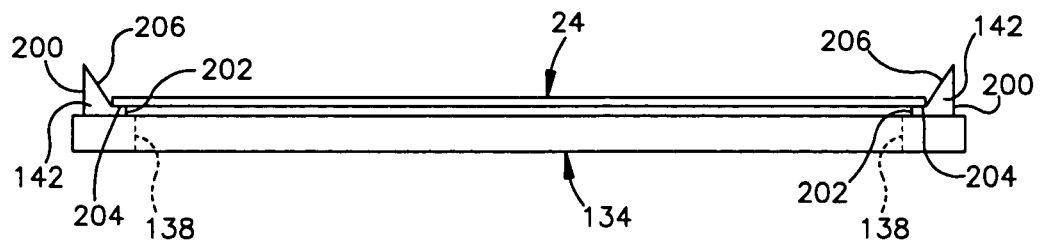
FIG. 3a is a side perspective view of a support tray of the work piece transfer system of FIG. 2.
Figure 4:
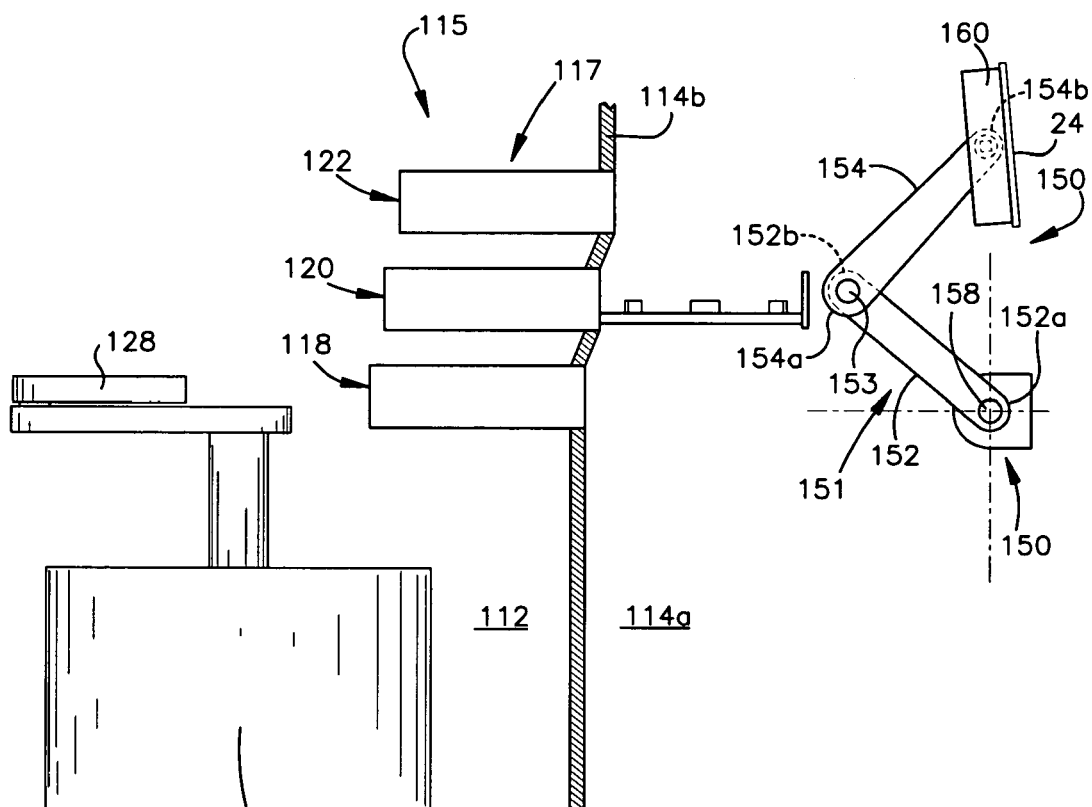
FIG. 4 is a schematic view, partly in side elevation and partly in section, of the work piece transfer system of FIG. 3.

Referring to FIG. 3a, the work piece holders 142 are located adjacent to the outer edge of the peripheral wall 138 of the opening 137. Each work piece holder includes a rear wall portion 200 which extends for substantially the height of the work piece holder 142. An inner wall portion 202 is positioned at a point directly adjacent to the opening 137 in the support tray 134. The inner wall 202 extends from the support tray to a wafer support portion 204. A bevel portion 206 extends from the top of the rear wall portion to the wafer support 204 in a substantially angular direction towards the opening 137 in the support tray 134. In the illustrated embodiment, the support tray 134 includes three wafer supports 142. The supports 142 are positioned about the opening 137 in a manner such that when a wafer 24 is placed on all three of the wafer supports 204 of the work piece holders 142 it is centrally positioned over the opening 137. During operation, a wafer 24 is caused to come in contact with the work piece support 142. The wafer 24 further contacts the bevel portion 206 where it is allowed to slide down the bevel portion 206 to a central final position, coming to rest on the wafer support 204. This operation allows the wafer 24 to be correctly position centrally over the opening 137 in the support tray 134 for processing.

The work piece support 150 causes the chuck 160 to continue in an upward, arcuate movement until the work piece 24 is in an implantation position. The movement of the support 150 is shown in FIG. 5. The ion beam 14 implants the work piece 24.

When the implantation of the work piece 24 is complete, the support 150 returns the work piece 24 to the support tray 134 by moving through the reverse of the travel path described for implantation. The chuck 160 is discharged, thus releasing the work piece 24 on the work piece holders 142. The support link 156 passes back through the notch in the support tray 134 and the chuck 160 passes through the circular portion of the opening 137 in the support tray 134. The work piece 24 is placed back in contact with the work piece holders 142 where it comes to rest. The chuck 160 continues through the support tray 134 to a position lower than the load lock 118.

Once the chuck 160 is clear of the support tray 134, the tray 134 retracts into the load lock housing 135 and the in-vac isolation valve 136 closes. Next, the in-air isolation valve 132 then opens and the in-air robot 126 removes the processed work piece 24 from the load lock 118 and places wafer in a storage area.

When the isolation valve 136 of the load lock 118 closes, the isolation valve 136 of the next upper load lock 120 opens and the process is repeated for the work piece positioned in the load lock 120. When the work piece positioned in the uppermost load lock 122 is implanted, the chuck 160 lowers to a position below the middle load lock 120 and the work piece positioned in the middle load lock 120 is then implanted. Finally, once the work piece of the middle load lock 120 is implanted, the chuck 160 is lowered to a position below the lowest load lock 118 and the process is started over again.

FIGS. 6 and 7 show the middle load lock 120 with the support tray 134 in an extended position. In accordance with the process provided above with respect to the lower load lock 118, the electrostatic chuck 160 is again charged and moves upward through the opening 137 in the support tray 134 to attract the unprocessed work piece and extends upward to an implantation position. After implantation, as shown in FIG. 6, the implanted work piece is lowered back to the support tray 134 and place on the work piece holders 142. The chuck 160 is discharged, releasing the work piece. The chuck 160 continues through the support tray 134 such that the support tray 134 can slide to its nonextended position and the in-vac isolation valve 136 can close. This process is again repeated for the wafer in the upper load lock 122.

In the illustrated embodiment, the load locks 118, 120, 122 are stacked one on top of another. In addition, the load locks 118, 120, 122 are off set such that the upper load lock 122 extends further into the in-vac region 114a of the implantation chamber 114 than the middle load lock 120 which, in turn, extends further into the in-vac region 114 than the lowest load lock 118. The relative positions of the load locks 118, 120, 122 generally conforms to the arcuate path of the wafer support 150 (having a pivot point located at the mount 158). As stated, the support linkage 150 has two degrees of freedom. The support linkage 151 can rotate about the mount 158 utilizing the first actuator. In addition, the second member 154 can move relative to the first member 152 by the second actuator. This allows the support linkage 151 freedom to move independently in two directions (shown as x and y axis in FIG. 5) in order to accurately capture work pieces from the load locks sliding trays 134 and accurately position the captured work pieces for implantation by the ion beam 14.

It is the intent that, although the invention has been described with a degree of particularity, the invention includes all modifications and alterations from the disclosed exemplary embodiment falling within the spirit or scope of the appended claims.

What is claimed is:

1. For use with an ion implanter having an implantation chamber for treatment of a work piece at sub-atmospheric pressure, a work piece transfer apparatus comprising:
  a) a load lock system in fluid communication with an interior region of the implantation chamber, the load lock system defining an interior region which can be selectively evacuated for achieving a reduced pressure condition in the interior region, the load lock system having a support surface for supporting the work piece, the load lock support surface including an opening aligned with the work piece when the work piece is disposed on the load lock support surface; and
  b) a work piece support within the implantation chamber that positions a work piece for treatment within the chamber interior region, the work piece support including a work piece pedestal for picking up the work piece from the support surface of the load lock system prior to treatment, holding the work piece in position during treatment, and depositing the work piece on the support surface of the load lock system subsequent to treatment, the work piece support including a support linkage for moving the work piece pedestal through the opening in the load lock support surface to pick up the work piece from the support surface prior to treatment and deposit the work piece on the support surface subsequent to treatment.

2. The work piece transfer apparatus of claim 1 wherein the apparatus further includes a robot system for transferring the work piece from a storage area external to the implantation chamber to the load lock system prior to treatment in the implantation chamber and from the load lock system to the storage area subsequent to treatment in the implantation chamber.

3. The work piece transfer apparatus of claim 1 comprising a support arm capable of independent movement along two axes.

4. The work piece transfer apparatus of claim 1 wherein the load lock system includes a plurality of load locks, each of the plurality of load locks defining an evacuable interior region in fluid communication with the implantation chamber interior region.

5. The work piece transfer apparatus of claim 4 wherein the number of load locks is three and the three load locks are disposed in a stacked arrangement.

6. The work piece transfer apparatus of claim 4 wherein each of the plurality of load locks includes a door adjacent the implantation chamber, which when opened, results in the load lock interior region being in fluid communication with the implantation chamber interior region.

7. The work piece transfer apparatus of claim 4 wherein each of the plurality of load locks includes a movable tray, each movable tray including a work piece support surface for supporting a work piece, the support surface including a central opening sized to permit the support pedestal to pass through the central opening to pick up the work piece from the tray work piece support surface and deposit the work piece on the support surface.

8. The work piece transfer apparatus of claim 7 wherein each movable tray moves along a path of travel between a retracted position where the tray is within its load lock interior region and an extended position where the tray extends into the implantation chamber interior region to facilitate the support pedestal passing through the central opening of the tray work piece support surface when a work piece is to be picked up from the tray work piece support surface or deposited on the tray work piece support surface.

9. The work piece transfer apparatus of claim 8 wherein each of the load locks includes an isolation valve system and the tray is a part of the isolation valve system of the load lock, the valve system permitting evacuation of the load lock interior region when the tray is in a retracted position.

10. The work piece transfer apparatus of claim 7 wherein for each tray, the tray work piece support surface includes passive work piece grip.

11. The work piece transfer apparatus of claim 1 wherein the work piece pedestal moves through the opening in the support surface of the load lock in a direction transverse to a plane defined by the load lock support surface.

12. The work piece transfer apparatus of claim 1 wherein the work piece pedestal moves through the opening in the support surface of the load lock in a direction substantially orthogonal to a plane defined by the load lock support surface.

13. A method of treating a work piece positioned in a reduced pressure implantation station with an ion beam, the steps of the method comprising:
a) providing a work piece transfer system including:
1) a load lock system in fluid communication with an interior region interior region of the implantation chamber, the load lock system defining an interior region which can be selectively evacuated for achieving a reduced pressure condition in the interior region, the load lock system having a support surface for supporting the work piece, the load lock support surface including an opening aligned with the work piece when the work piece is disposed on the load lock support surface; and
2) a work piece support within the implantation chamber that positions a work piece for treatment within the chamber interior region, the work piece support including a work piece pedestal for picking up the work piece from the support surface of the load lock system prior to treatment, holding the work piece in position during treatment, and depositing the work piece on the support surface of the load lock system subsequent to treatment, the work piece support including a support linkage for moving the work piece pedestal through the opening in the load lock support surface to pick up the work piece from the support surface prior to treatment and deposit the work piece on the support surface subsequent to treatment;
b) positioning a work piece on the support surface of the load lock system;
c) utilizing the work piece support to pick up the work piece from the support surface of the load lock system and holding the work piece in position in the implantation chamber interior region for treatment;
d) treating the work piece; and
e) utilizing the work piece support to deposit the work piece on the support surface of the load lock system subsequent to completion of treatment.

14. The method of treating a work piece set forth in claim 13 wherein the work piece transfer system further includes a robot system for transferring the work piece from a storage area external to the implantation chamber to the load lock system prior to treatment in the implantation chamber and from the load lock system to the storage area subsequent to treatment in the implantation chamber.

15. The method of treating a work piece set forth in claim 13 comprising a support arm of the work piece transfer system capable of independent movement along two axes.

16. The method of treating a work piece set forth in claim 13 wherein the load lock system of the work piece transfer system includes a plurality of load locks, each of the plurality of load locks defining an evacuable interior region in fluid communication with the implantation station interior region.

17. The method of treating a work piece set forth in claim 16 wherein the number of load locks is three and the three load locks are disposed in a stacked arrangement.

18. The method of treating a work piece set forth in claim 16 wherein each of the plurality of load locks includes a door adjacent the implantation station, which when opened, results in the load lock interior region being in fluid communication with the implantation chamber interior region.

19. The method of treating a work piece set forth in claim 16 wherein each of the plurality of load locks includes a movable tray, each movable tray including a work piece support surface for supporting a work piece, the support surface including a central opening sized to permit the support pedestal to pass through the central opening to pick up the work piece from the tray work piece support surface and deposit the work piece on the support surface.

20. The method of treating a work piece set forth in claim 19 wherein each movable tray moves along a path of travel between a retracted position where the tray is within its load lock interior region and an extended position where the tray extends into the implantation station interior region to facilitate the support pedestal passing through the central opening of the tray work piece support surface when a work piece is to be picked up from the tray work piece support surface or deposited on the tray work piece support surface.

21. The method of treating a work piece set forth in claim 19 wherein for each tray, the tray work piece support surface includes passive work piece grip.

22. The method of treating a work piece set forth in claim 13 wherein the work piece pedestal of the work piece transfer system moves through the opening in the support surface of the load lock in a direction transverse to a plane defined by the load lock support surface.

23. The method of treating a work piece set forth in claim 13 wherein the work piece pedestal of the work piece transfer system moves through the opening in the support surface of the load lock in a direction substantially orthogonal to a plane defined by the load lock support surface.

* * * * *